US006635824B1

United States Patent
Oka

(10) Patent No.: US 6,635,824 B1
(45) Date of Patent: *Oct. 21, 2003

(54) JUNCTION CONNECTOR FOR WIRE HARNESSES

(75) Inventor: Yoshita Oka, Tokyo (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/620,598

(22) Filed: Jul. 20, 2000

(30) Foreign Application Priority Data

Jul. 21, 1999 (JP) ............................................. 11-206402

(51) Int. Cl.[7] ................................................. H01R 4/00
(52) U.S. Cl. ..................... 174/72 C; 439/949; 174/72 B
(58) Field of Search ............................. 174/72 C, 72 B; 439/22, 404, 76.2, 949

(56) References Cited

U.S. PATENT DOCUMENTS

| | | | | |
|---|---|---|---|---|
| 2,019,625 A | * | 11/1935 | O'Brien | 174/260 |
| 2,977,672 A | | 4/1961 | Telfer | |
| 5,057,026 A | | 10/1991 | Sawai et al. | |
| 5,199,899 A | * | 4/1993 | Ittah | 439/403 |
| 5,501,605 A | * | 3/1996 | Ozaki et al. | 439/34 |
| 5,507,668 A | | 4/1996 | Lambrinos et al. | |
| 5,624,280 A | * | 4/1997 | Kato | 439/724 |
| 5,626,492 A | * | 5/1997 | Onizuka et al. | 439/512 |
| 5,820,404 A | * | 10/1998 | Chishima et al. | 439/417 |
| 5,920,034 A | * | 7/1999 | Saka et al. | 174/59 |
| 6,140,980 A | * | 10/2000 | Spitzer et al. | 345/8 |
| 6,162,990 A | * | 12/2000 | Sakamoto | 174/59 |
| 6,244,877 B1 | * | 6/2001 | Asao | 439/76.2 |
| 6,264,510 B1 | * | 7/2001 | Onizuka et al. | 439/876 |
| 6,270,361 B1 | * | 8/2001 | Onizuka et al. | 439/76.2 |
| 6,290,509 B1 | * | 9/2001 | Hattori et al. | 439/76.2 |

FOREIGN PATENT DOCUMENTS

| | | |
|---|---|---|
| EP | 0994639 | 4/2000 |
| JP | 5-326088 | 12/1993 |

OTHER PUBLICATIONS

Japanese Application P2000–182682A.*
Japanese Application P2001–16745A.*

* cited by examiner

Primary Examiner—Dean A. Reichard
Assistant Examiner—Jinhee Lee
(74) Attorney, Agent, or Firm—Greenblum & Bernstein, P.L.C.

(57) ABSTRACT

A junction connector is provided that can be connected with wire harnesses from different directions. The junction connector includes a shell containing junction circuits including at least two connector-fitting portions oriented in different directions. The junction circuits include a plurality of bus bar layers, each of the bus bar layers including a bus bar group. Each of the bus bars is formed into the shape of a strip having two end tabs and are aligned at a given interval from each other along the same direction. The bus bar layers are superposed so that the bus bars groups are arranged in a skewed direction relative to each other, thereby forming cross points between the bus bar groups, and the bus bars are joined at the cross points, for example by bonding, thereby forming junction circuits. Connectors bound to wire harnesses are then fitted into the connector-fitting portions, so that the electrical cables in the wire harnesses are splice-connected through the bus bars.

20 Claims, 9 Drawing Sheets

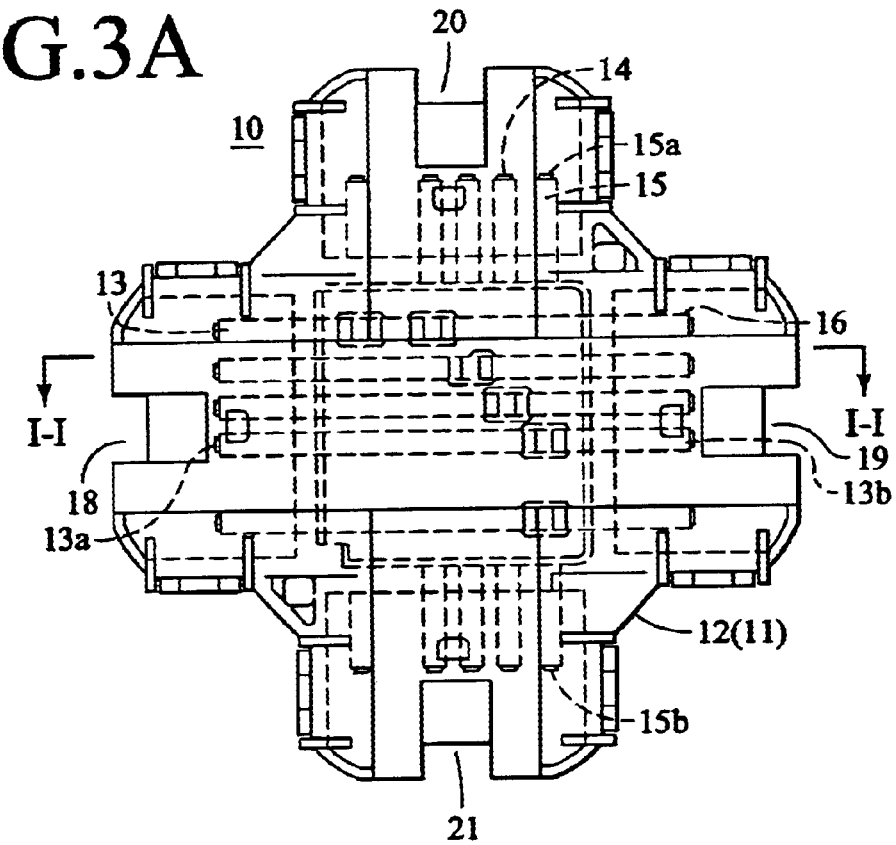
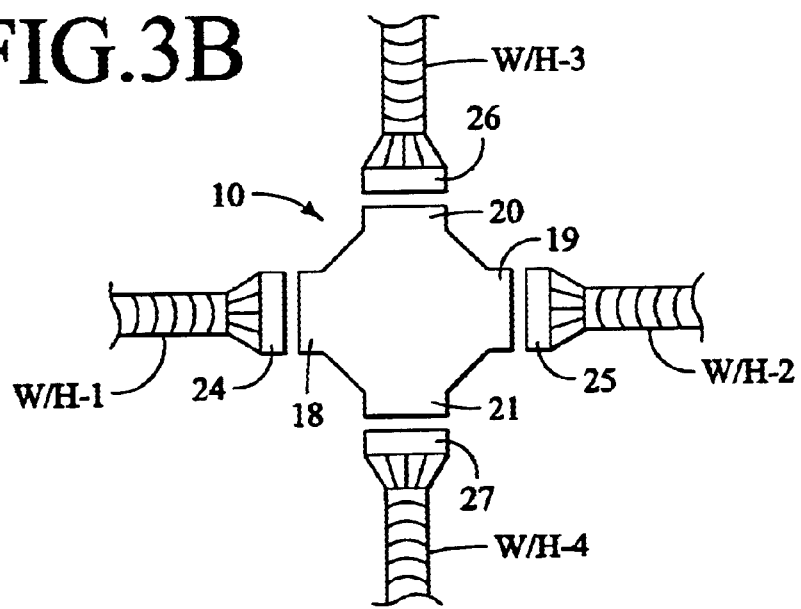

JUNCTION CONNECTOR FOR WIRE HARNESSES

BACKGROUND OF THE INVENTION

1. Field of the Invention

The present invention relates to a junction connector incorporated into wire harnesses used in automobiles. More particularly, the invention concerns a junction connector, in which electrical cables can be connected from different directions.

2. Description of Background Information

The wiring of harnesses in an automobile also involves the installation of electrical connector housings, such as junction boxes, comprising internal circuits. When a splicing operation cannot be carried out in the internal circuits, the junction connector is connected to electrical cables, prior to the splicing operation. In such a case, junction connectors having a structure shown in FIG. 1 are commonly used.

The above junction connector 1 includes a case 2 with a fitting recess 1a. The fitting recess contains a plurality of junction bus bars 3 provided with respective tabs 3a. Electrical cables w are branched out from a wire harness W/H. The ends of such electrical cables w are provided with terminals. These terminals are inserted into a connector 4 and locked therein. The connector 4 is then engaged with the fitting recess 1a in the junction connector 1 and locked, whereby the electrical cables w are joined. The connector 4 and the junction connector 1 are bound to the wire harness W/H by taping.

In the above junction connector 1, the tabs 3a of the junction bus bars 3 are oriented in the same direction. Moreover, the junction connector 1 has only one fitting recess 1a into which the counterpart connector 4 is fitted. Because of this single orientation of the fitting recess 1a, the junction connector 1 can receive the counterpart connector 4 only from one direction.

As shown in FIG. 2, the wire harnesses W/H, e.g. W/H-1, -2, -3 and -4 may be wired in a T or cross configuration. However, the junction connector 1 can receive only one counterpart connector 4 from one direction. Therefore, when some electrical cables of these wire harnesses W/H need to be spliced, the electrical cables to be spliced are forcibly inserted into a wire harness W/H, as shown in FIG. 1, so that the wire harnesses W/H are connected to the junction connector 1.

In the above structure, the wire harnesses W/H, and the constituent electrical cables w connecting to the junction connector 1, are not configured in the most suitable way. Furthermore, setting-up positions of the junction connector become restricted, so that the junction connector cannot always be placed appropriately in the limited space of an automobile.

In view of the above, an object of the present invention is to provide a junction connector which can be connected from a plurality of directions, enables optimum distributions of wire harnesses, and which can be arranged in an appropriate position inside the effective space of an automobile.

SUMMARY OF THE INVENTION

To this end, there is provided a junction connector including a shell which contains junction circuits and at least two connector-fitting portions oriented in different directions. The junction circuits includes at least a first bus bar layer and a second bus bar layer, which include first and second bus bars, respectively. Further, the first and second bus bars have two respective end tabs and are aligned at a given interval from each other in the same direction, respectively. The second bus bar layer is then superposed on the first bus bar layer such that the direction of the second bus bars are skewed relative to that of the first bus bars, thereby forming cross points between the first bus bars and the second bus bars. The first and second bus bars are then bonded through the cross points, thereby forming junction circuits.

In this junction connector structure, the orientation of connector-fitting portions can be very easily arranged in different directions. Accordingly, when electrical cables are splice-connected through the junction connector, there is no need to group them in one wire harness. The circuits can thus be designed as a function of the wired condition of wire harnesses and/or the set-up space for the junction connector. As a result, wire harnesses can be divided in an optimum way.

In the above junction connector, the shell defines peripheral rims. The second bus bar layer may then be superposed on the first bus bar layer such that the second bus bars are arranged perpendicular to the first bus bars. Further, the shell may include at least three connector-fitting portions which are provided on the peripheral rims and separated at an angle of 90 degrees from each other around the center axis of the shell. The connector-fitting portions may then contain the end tabs of the first and second bus bars.

As a variant, at least one of the at least first and second bus bar layers may include at least one bus bar having upwardly- and/or downwardly-bent end tabs, and the shell may include corresponding upward- and/or downward connector-fitting portions.

The connector-fitting portions may be arranged at an angle of 90 degrees from each other in the horizontal direction, measured around the center axis of the shell. Further, an upward and a downward connector-fitting portion may be added, bringing the total number of connector-fitting portions to six.

Where necessary, the number of bus bar layers may be more than two. A bus bar layer may be added in a crossed direction over the adjacent bus bar layer, but it can also be laid out at a desired skewed angle, e.g. at 45 degrees. In this manner, multi-directional connector-fitting portions may be produced.

Preferably, an insulating sheet is interposed between the at least a first bus bar layer and the second bus bar layer. The insulating sheet is provided with openings at the positions corresponding to the cross points. The first bus bars included in the first bus bar layer are then bent into the openings, so that they are brought into contact with the second bus bars included in the second bus bar layer, and joined therewith.

As a variant, the junction connector further includes a third bus bar layer with corresponding third bus bars and end tabs likewise arranged. The third bus bar layer is then superposed on the second bus bar layer such that the direction of the third bus bars is skewed relative to that of the second bus bars, thereby forming cross points between the second bus bars and the third bus bars. The second and third bus bars are then bonded through the cross points, thereby forming junction circuits.

Preferably, a second insulating sheet is interposed between the second bus bar layer and the third bus bar layer. The second insulating sheet is then provided with openings at positions corresponding to the cross points. Subsequently, the second bus bars and the third bus bars are bent into the openings, so that the second bus bars are brought into contact with the third bus bars through the openings, and bonded therewith.

BRIEF DESCRIPTION OF THE DRAWINGS

The above and the other objects, features and advantages of the present invention will be made apparent from the following description of the preferred embodiments, given as non-limiting examples, with reference to the accompanying drawings, in which:

FIG. 3A is a top plan view of the junction connector according to a first embodiment of the invention;

FIG. 3B is a schematic view showing the fitting directions between wire harness ends and the junction connector of FIG. 3A;

DETAILED DESCRIPTION OF THE PREFERRED EMBODIMENTS

Figure 1:
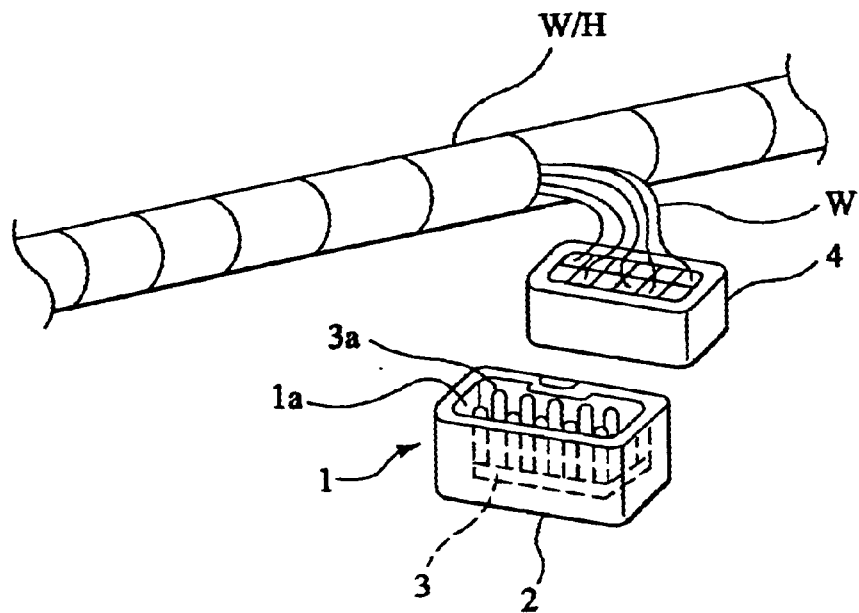
FIG. 1 is a perspective view of a wire harness, a connector and a junction connector known in the prior art.
Figure 2:
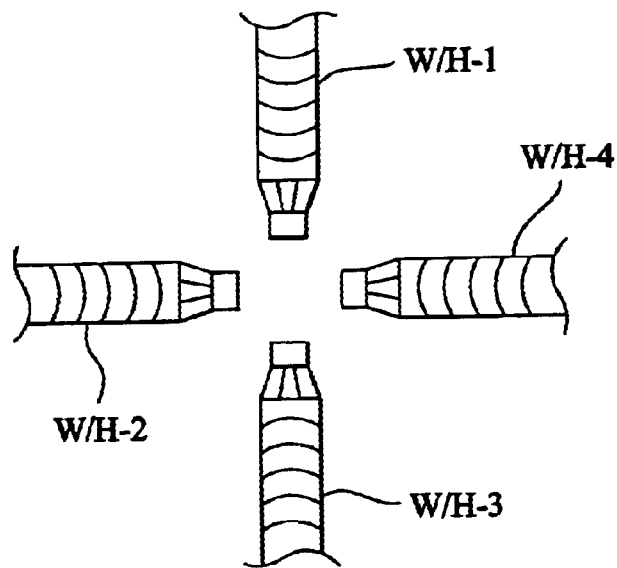
FIG. 2 is a view schematically showing how wire harnesses are joined to a connector according to the prior art.
Figure 4A:
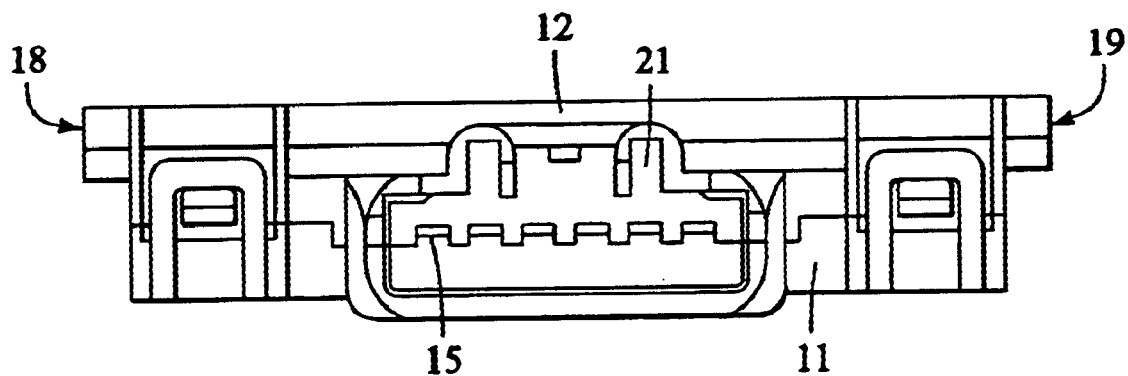
FIG. 4A is a side view of the junction connector of FIG. 3A.
Figure 4B:
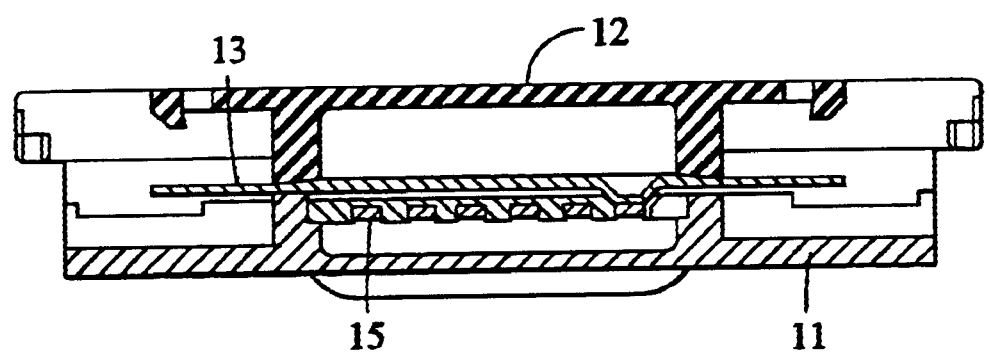
FIG. 4B is a cross-sectional view along line I—I of the junction connector of FIG. 3A.
Figure 5A:
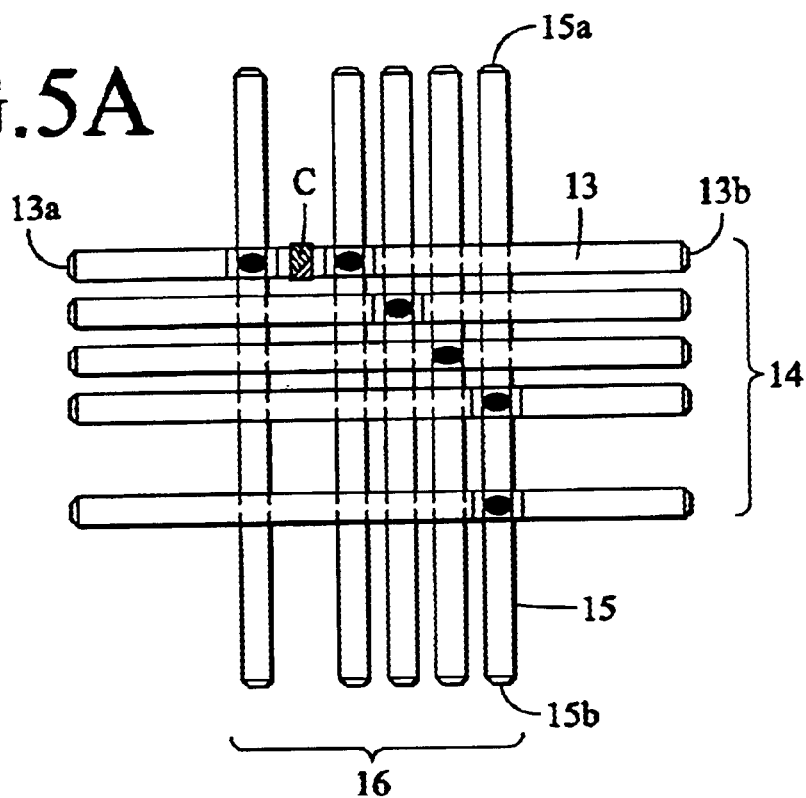
FIG. 5A is a top plan view showing the arrangement between an X-directional bus bar layer and a Y-directional bus bar layer.
Figure 5B:
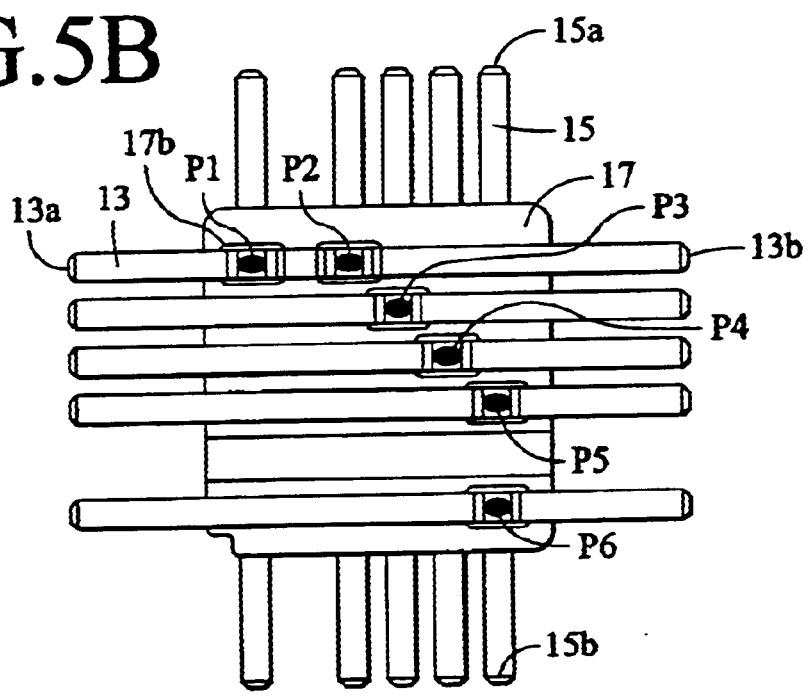
FIG. 5B is a top plan view when an insulating sheet is interposed between the X-directional bus bar layer and the Y-directional bus bar layer of FIG. 5A.

FIGS. 3 to 7 show a junction connector 10 according to a first embodiment of the invention. The junction connector 10 includes a bottom shell 11 and a top shell 12, and the whole structure has a substantially thin square shape. Inside the junction connector 10, first bus bars 13 in the form of a strip are arranged in parallel along the same direction (for example, the X direction), at a given spacing from each other, thereby forming a first bus bar layer 14. Second bus bars 15 having the same shape are likewise arranged, but in a direction (Y direction) perpendicular to the X direction, so as to form a second bus bar layer 16. These two layers 14 and 16 are superposed with an insulating sheet 17 interposed therebetween.

Figure 6A:
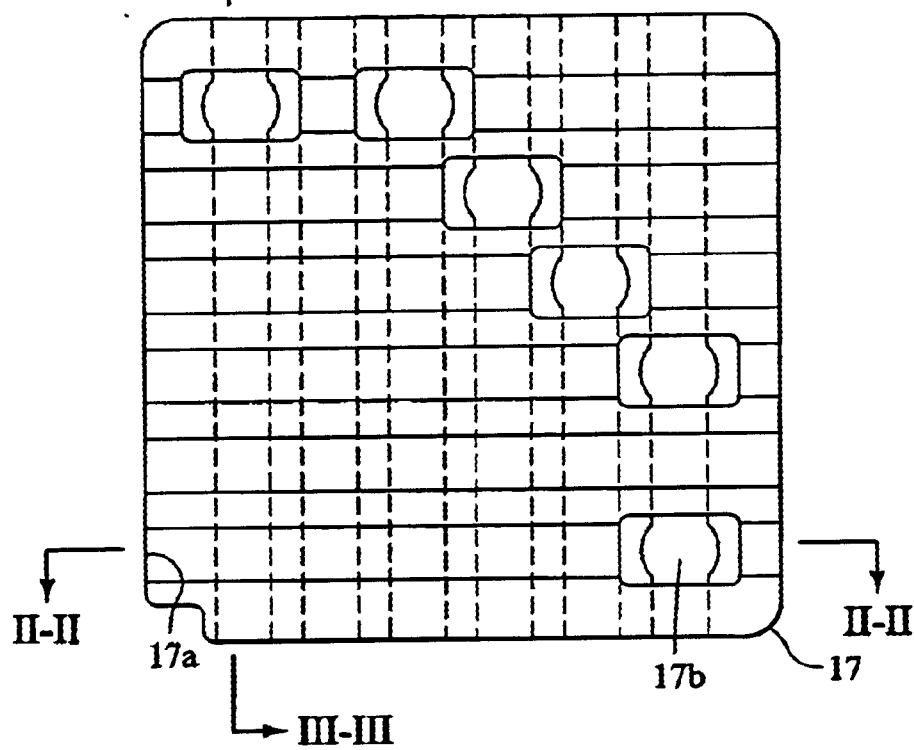
FIG. 6A is a top plan view of an insulating sheet.
Figure 6B:
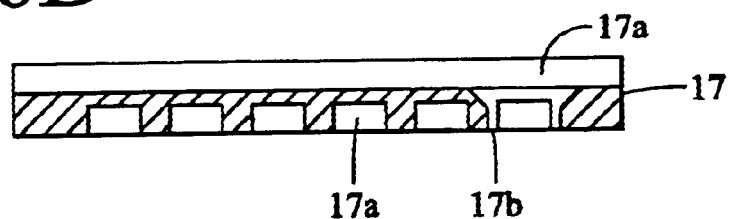
FIG. 6B is a cross-sectional view along line II—II of the insulating sheet of FIG. 6A.
Figure 6C:
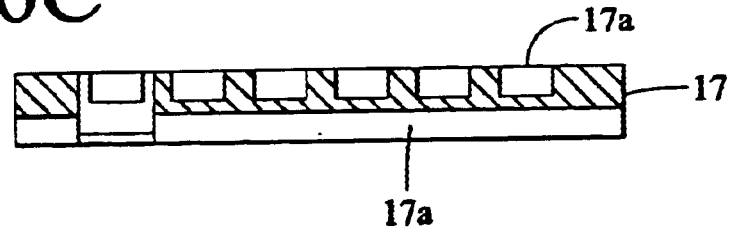
FIG. 6C is a cross-sectional view along line III—III of the insulating sheet of FIG. 6A.
Figure 7:
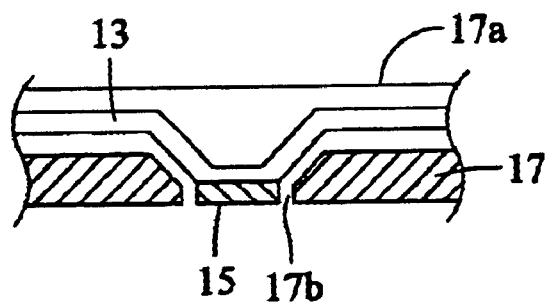
FIG. 7 is a cross-sectional view showing how two bus bar layers are connected through the insulating sheet.

As shown in FIGS. 6A and 6B, the two faces of the insulating sheet 17 are provided with a set of grooves 17a respectively in a cross arrangement. The first bus bars 13 in the first bus bar layer 14 and the second bus bars 15 in the second bus bar layer 16 are then fitted into the crossing grooves 17a on the opposite sides of the insulating sheet 17. When selected first bus bars 13 and second bus bars 15 are to be connected together, the connections are made at cross positions P1 to P6. To this end, the interposed insulating sheet 17 includes openings 17b. The bus bars 13 are then bent in a U shape (note FIG. 7), so as to be brought into contact with the bus bars 15. Both bus bars 13 and 15 are joined in this condition, for example, by resistance welding. When there is an unused portion in the circuitry, for example portion C in FIG. 5A, the corresponding bus bar is removed from that portion.

The opposite ends of the bus bars 13 and 15 are provided with a respective end tab 13a, 13b, 15a or 15b. When the bottom shell 11 and the top shell 12 are joined, they define four sides. There are provided connector-fitting portions 18, 19, 20 and 21 (FIG. 3A) projecting from these respective sides. The end tabs 13a, 13b, 15a and 15b protrude into the corresponding connector-fitting portions 18, 19, 20 and 21. This configuration enables the junction connector 10 to be connected with counter-part connectors from different directions.

In this configuration, the junction connector 10 is connected with connectors 24 to 27 (FIG. 3B) at 90° to each other, measured around the center axis of the shell. The splice circuits can thus be prepared as desired. Accordingly, to form splice circuits, it is no longer necessary to incorporate electrical cables into one wire harness. Instead, the electrical cables to be spliced can be divided into wire harnesses W/H-1, -2, -3 and -4 in any suitable way.

Figure 8:
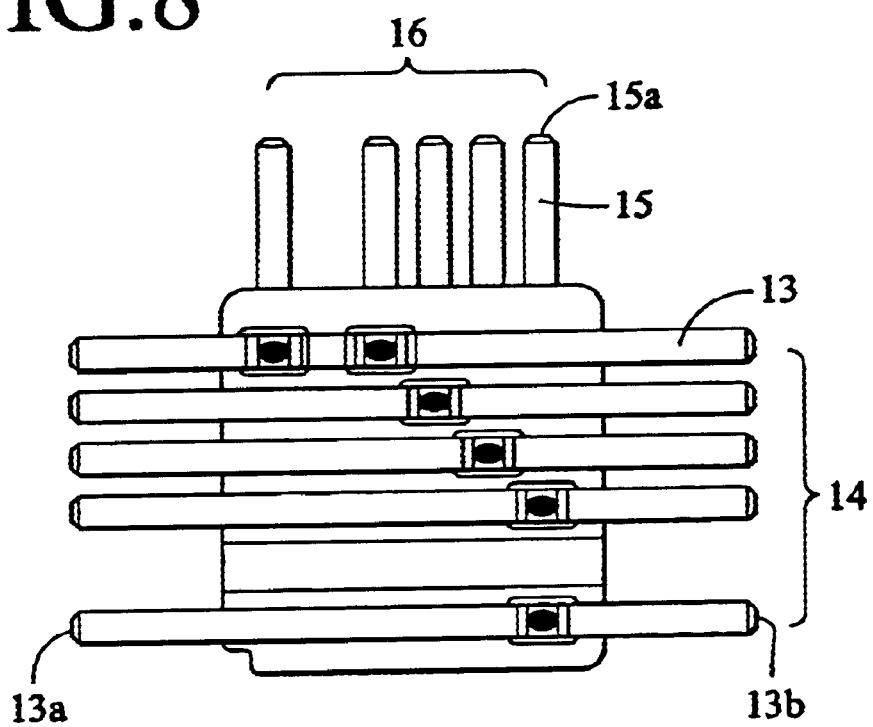
FIG. 8 is a top plan view showing how bus bar layers are superposed according to a variant of the first embodiment of the invention.

FIG. 8 shows a variant of the first embodiment. The first bus bar layer 14 and the second bus bar layer 16 are formed in a junction circuit, as in the first embodiment. However, only one end of the second bus bars 15, which form the second bus bar layer 16, includes an end tab 15a connecting to a counterpart connector, and the other end is left open. By contrast, the first bus bars 13, which form the first bus bar layer 14, include two ends respectively provided with an end tab 13a and 13b, as in the first embodiment. In the variant, the connector-fitting portions of the junction connector 10 have three directions, and are disposed at a 90° angle to neighboring connector, around the center axis of the shell.

Figure 9:
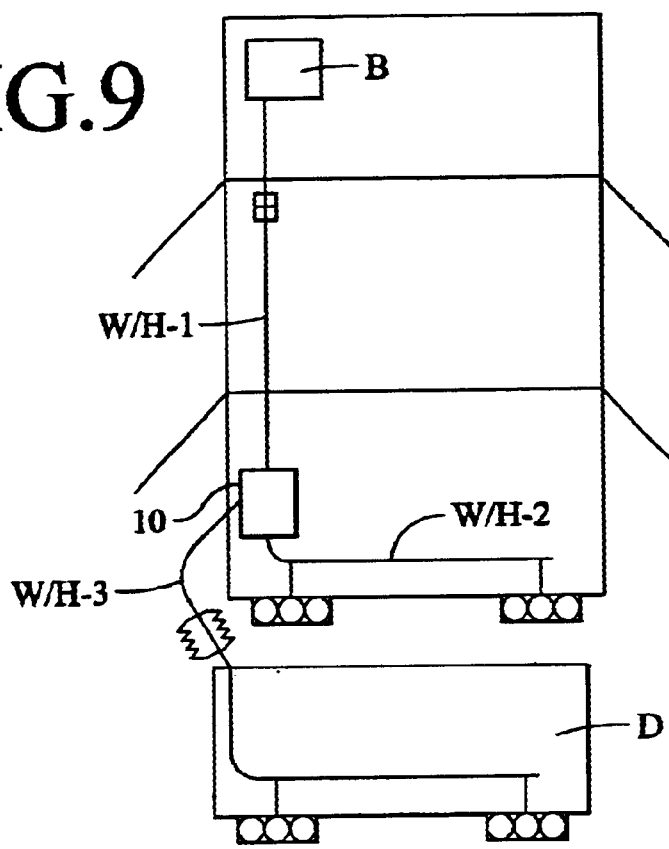
FIG. 9 is a schematic view showing a location where the junction connector of FIG. 8 is applied.

The junction connector 10 including three connector-fitting portions may be installed in a rear lamp circuit, including a battery B, of a vehicle having a rear door D, as shown in FIG. 9. The junction connector 10 can thus be mounted between floor harnesses W/H-1, -2 and -3, which extend in three directions. Desired splice circuits may thus be formed in an appropriate way.

Figure 10A:
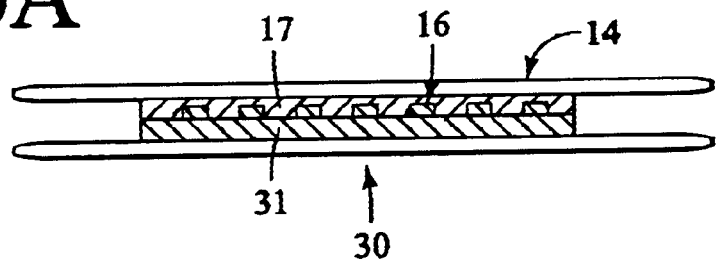
FIG. 10A is a cross-sectional view of the junction connector according to a second embodiment of the invention.
Figure 10B:
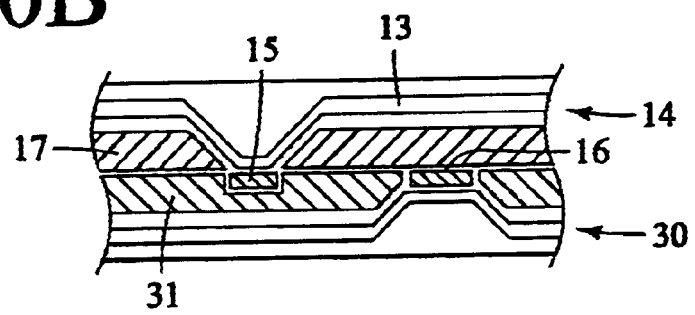
FIG. 10B is a cross-sectional view of a resistance-welded portion between the first and second bus bars of the junction connector of FIG. 10A.

FIGS. 10A and 10B show a second embodiment in which a third bus bar layer 30 is aligned in the X direction and added to the first and second bus bar layers 14 and 16. The bus bar layers 14 and 30 arranged in the X direction thus flank, or are positioned on either side of, the bus bar layer 16 arranged in the Y direction. Insulating sheets 17 and 31 are interposed between the bus bar layers, as in the first embodiment.

In order to connect the three bus bar layers 14, 16 and 30, the insulating sheet interposed between the two adjacent bus bar layers is provided with openings, as in the first embodiment. One of the bus bar layers is bent into a U shape, and thus brought into contact with the other bus bar layer. Both layers are then joined, for example, by resistance welding.

When splice-connecting many circuits, it suffices to increase the number of bus bar layers arranged either in the X or Y direction. Further, when an added bus bar layer is skewed by 45 degrees, instead of 90 degrees, relative to an adjacent layer along a bus bar direction, more than four connector-fitting portions can be formed in the horizontal direction.

Figure 11A:
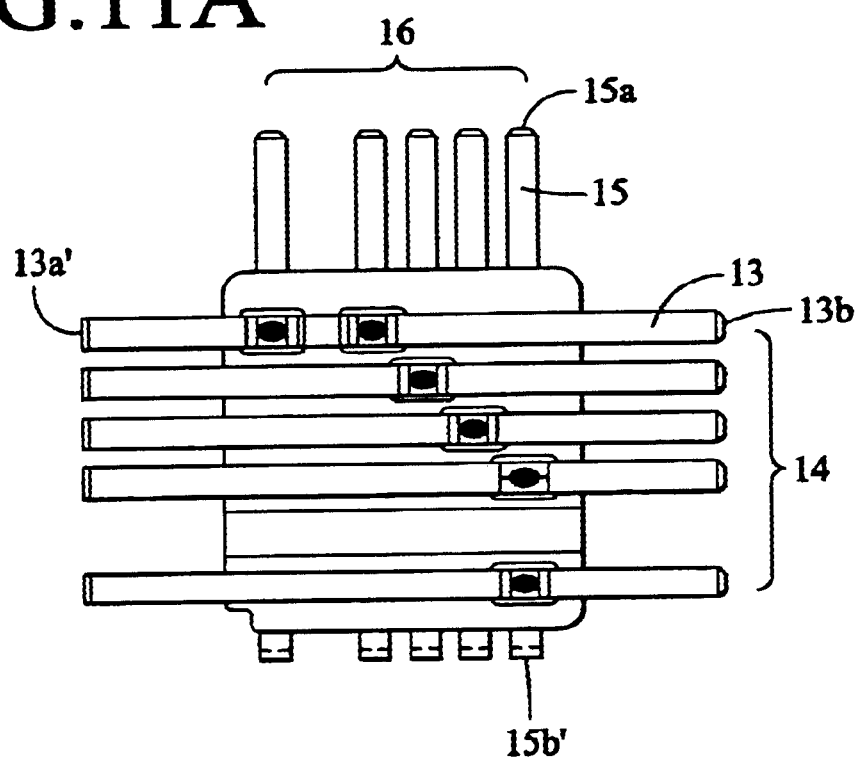
FIG. 11A is a top plan view of the junction connector according to a third embodiment of the invention.
Figure 11B:
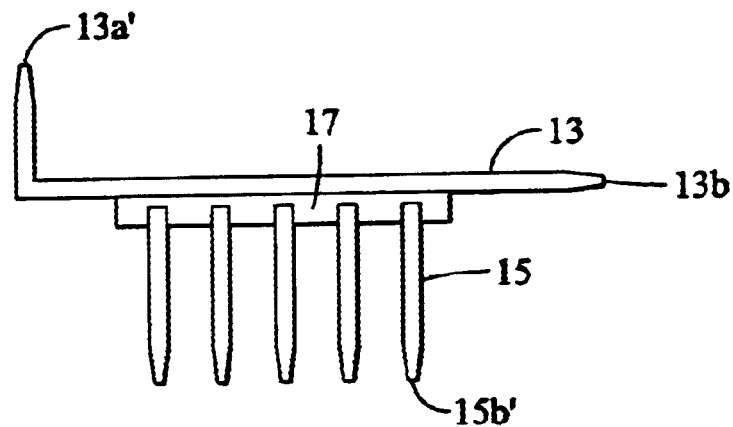
FIG. 11B is a cross-section of the elevational side view of the junction connector of FIG. 11A.

FIG. 11 shows a third embodiment of the present invention, in which one end of each of the first bus bars 13, which constitute the X-directional first bus bar layer 14, is bent upwardly (in the top plan view of FIG. 11A), to form upwardly extending end tabs 13a'. The other end of each of the first bus bars 13 extends horizontally, so as to form horizontal end tabs 13b. Furthermore, one end of each of the second bus bars 15, which constitute the Y-directional second bus bar layer 16, is bent downwardly to form downward end tabs 15b'. The other end of each of the bus bars 15 extends horizontally, so as to form horizontal end tabs 15a.

The bottom shell and the top shell include connector-fitting portions which are oriented along the directions of end tabs. For example, the bottom shell may include a downwardly extending connector-fitting portion from which the end tabs 15b' project, while the top shell may include an upwardly extending connector-fitting portion corresponding to the end tabs 13a'. Further, the other connector-fitting portions may be provided on the outer rims of the bottom and top shells at an angle of 90 degrees around the center axis of the shell, from which the end tabs 13b and 15a project.

In this manner, there are provided two horizontally-directed connector fitting portions, and two connector-fitting portions directed upwards and downwards, respectively separated at an angle of 90 degrees around the center axis of the shell. Counterpart connectors can thus be connected from four different directions. Accordingly, the wire harnesses can be divided in the functionally most suitable way.

Figure 12:
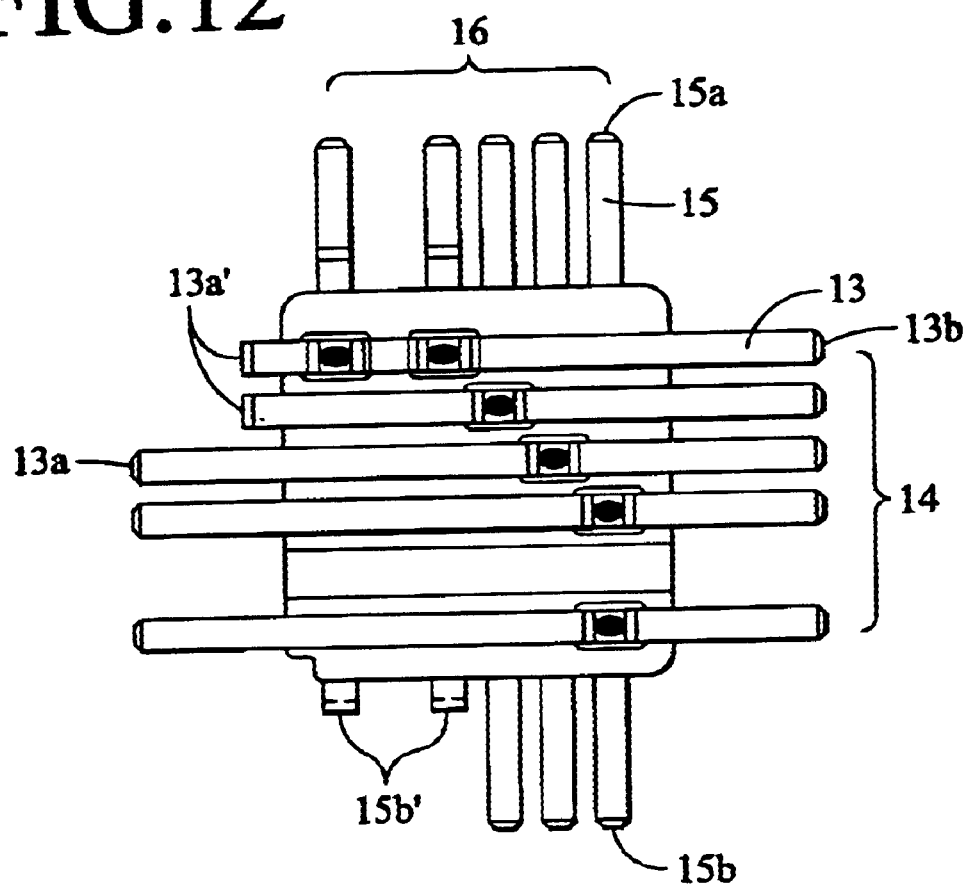
FIG. 12 is a top plan view of a variant according to the third embodiment of the invention.

FIG. 12 shows a variant of the third embodiment of the invention, in which one end of some of the first bus bars 13, which constitute the X- directional first bus bar layer 14, is bent upwards, so as to form upward end tabs 13a', while one end of the other first bus bars 13 forms horizontal end tabs 13a. Likewise, some of the second bus bars 15, which constitute the Y- directional second bus bar layer 16, may have one end provided with downward end tabs 15b', while one end of the other second bus bars 15 may be provided with horizontal end tabs 15b.

Together with four horizontal connector-fitting portions formed at an interval of 90 degrees, there is further provided an upward and a downward connector-fitting portion, amounting to six connector-fitting portions with different directions.

Figure 13:
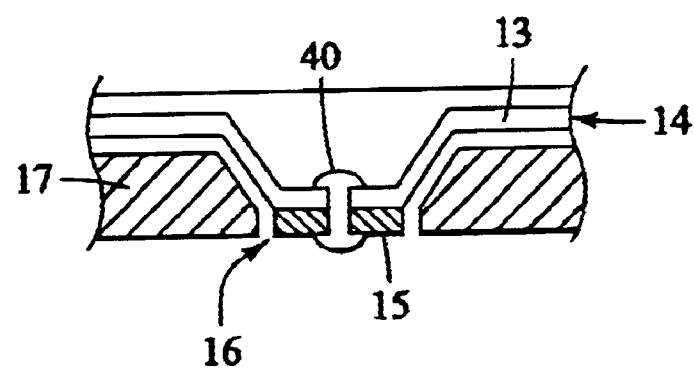
FIG. 13 is a cross-sectional view of a riveted portion between the first and second bus bars of the junction connector according to a fourth embodiment of the invention.

FIG. 13 shows a fourth embodiment of the present invention, in which the X-directional first bus bars 13 and the Y-directional second bus bars 15 are joined by fasteners, for example, by rivets 40, instead of resistance welding.

In the junction connector according to the invention, connector-fitting portions, through which are fitted the counterpart connectors bound to wire harnesses, can be designed to be oriented in different directions as desired. The wire harnesses can thus be divided suitably, as a function of the wiring conditions, and their branching positions can be chosen depending on the effective space in an automobile.

Furthermore, the internal circuits of the junction connector are made by combining bus bar strips. These bus bar strips can be produced very easily at a low cost. Although the invention has been described with reference to particular means, materials and embodiments, it is to be understood that the invention is not limited to the particulars disclosed and extends to all equivalents within the scope of the claims. The present disclosure relates to subject matter contained in priority Japanese Application No. HEI 11-206402, filed on Jul. 21, 1999, which is herein expressly incorporated by reference in its entirety.

What is claimed:

1. A junction connector comprising a shell which contains junction circuits and at least two connector-fitting portions oriented along different directions, said junction circuits comprising at least a first bus bar layer and a second bus bar layer, said first and second bus bar layers including first and second sets of bus bars, respectively, said first and second sets of bus bars having two respective end tabs and being aligned at a given interval from each other in the same direction, respectively, each of said connector-fitting portions projecting from said shell and being configured to receive said respective end tabs protruding therein and to electrically connect said respective end tabs and a connector fitted on said connector-fitting portion, said second bus bar layer being superposed on said first bus bar layer such that the direction of said second set of bus bars is skewed relative to that of said first set of bus bars, thereby forming cross points between said first set of bus bars and said second set of bus bars, said first and second sets of bus bars being joined at said cross points, thereby forming junction circuits.

2. The junction connector according to claim 1, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being bonded through said cross points, thereby forming junction circuits.

3. The junction connector according to claim 2, wherein a second insulating sheet is interposed between said second bus bar layer and said third bus bar layer, said second insulating sheet being provided with openings at positions corresponding to said cross points, and said second set of bus bars and said set of third bus bars are bent into said openings, so that said second set of bus bars is brought into contact with said third set of bus bars through said openings, and said second set of bus bars is joined to said third set of bus bars.

4. The junction connector according to claim 1, wherein an insulating sheet is interposed between said first bus bar layer and second bus bar layer, said insulating sheet being provided with openings at positions corresponding to said cross points, said first set of bus bars included in said first bus bar layer is bent into said openings and is bent into contact with said second set of bus bars included in said second bus bar layer, and said first set of bus bars is joined to said second set of bus bars.

5. The junction connector according to claim 4, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being joined at said cross points, thereby forming junction circuits.

6. The junction connector according to claim 5, wherein a second insulating sheet is interposed between said second bus bar layer and said third bus bar layer, said second insulating sheet being provided with openings at positions corresponding to said cross points, and said second set of bus bars and said third set of bus bars are bent into said openings, so that said second set of bus bars is brought into contact with said third set of bus bars through said openings, and said second set of bus bars is joined to said third set of bus bars.

7. The junction connector according to claim 1, wherein at least one of said first and second bus bar layers includes at least one bus bar comprising at least one of upwardly and downwardly bent end tabs, and said shell comprises corresponding upwardly and downwardly connector-fitting portions.

8. The junction connector according to claim 7, wherein an insulating sheet is interposed between said first bus bar layer and second bus bar layer, said insulating sheet being provided with openings at the positions corresponding to said cross points, said first set of bus bars included in said first bus bar layer is bent into said openings and is bent into contact with said second set of bus bars included in said second bus bar layer, and said first set of bus bars is joined to said second set of bus bars.

9. The junction connector according to claim 8, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being joined at said cross points, thereby forming junction circuits.

10. The junction connector according to claim 7, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being joined at said cross points, thereby forming junction circuits.

11. The junction connector according to claim 10, wherein a second insulating sheet is interposed between said second bus bar layer and said third bus bar layer, said second insulating sheet being provided with openings at positions corresponding to said cross points, and said second set of bus bars and said third set of bus bars are bent into said openings, so that said second set of bus bars is brought into contact with said third set of bus bars through said openings, and said second set of bus bars is joined to said third set of bus bars.

12. The junction connector according to claim 1, wherein said shell defines peripheral rims, said second bus bar layer is superposed on said first bus bar layer such that said second set of bus bars is arranged perpendicular to said first set of bus bars, said shell includes at least three connector-fitting portions which are provided on said peripheral rims and separated at an angle of 90 degrees from each other around the central axis of said shell, and said connector-fitting portions contain said end tabs of said first and second sets of bus bars.

13. The junction connector according to claim 12, wherein an insulating sheet is interposed between said first bus bar layer and second bus bar layer, said insulating sheet being provided with openings at the positions corresponding to said cross points, said first set of bus bars included in said first bus bar layer is bent into said openings and is bent into contact with said second set of bus bars included in said second bus bar layer, and said first set of bus bars are joined to said second set of bus bars.

14. The junction connector according to claim 13, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being joined at said cross points, thereby forming junction circuits.

15. The junction connector according to claim 12, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being joined at said cross points, thereby forming junction circuits.

16. The junction connector according to claim 15, wherein a second insulating sheet is interposed between said second bus bar layer and said third bus bar layer, said second insulating sheet being provided with openings at positions corresponding to said cross points, and said second set of bus bars and said third set of bus bars are bent into said openings, so that said second set of bus bars is brought into contact with said third set of bus bars through said openings, and said second set of bus bars is joined to said third set of bus bars.

17. The junction connector according to claim 12, wherein at least one of said first and second bus bar layers includes at least one bus bar comprising at least one of upwardly and downwardly bent end tabs, and said shell comprises corresponding upwardly and downwardly connector-fitting portions.

18. The junction connector according to claim 17, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being joined at said cross points, thereby forming junction circuits.

19. The junction connector according to claim 17, wherein an insulating sheet is interposed between said first bus bar layer and second bus bar layer, said insulating sheet being provided with openings at the positions corresponding to said cross points, said first set of bus bars included in said first bus bar layer is bent into said openings and is bent into contact with said second set of bus bars included in said second bus bar layer, and said first set of bus bars is joined to said second set of bus bars.

20. The junction connector according to claim 19, further comprising, in addition to said first and second bus bar layers, a third bus bar layer with a corresponding third set of bus bars and end tabs likewise arranged, wherein said third bus bar layer is superposed on said second bus bar layer such that the direction of said third set of bus bars is skewed relative to that of said second set of bus bars, thereby forming cross points between said second set of bus bars and said third set of bus bars, said second and third sets of bus bars being joined at said cross points, thereby forming junction circuits.

* * * * *